(12) United States Patent
Yamanaka

(10) Patent No.: US 8,680,791 B2
(45) Date of Patent: Mar. 25, 2014

(54) ORGANIC EL PANEL

(75) Inventor: Yoshiomi Yamanaka, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 123 days.

(21) Appl. No.: 13/508,316

(22) PCT Filed: Oct. 15, 2010

(86) PCT No.: PCT/JP2010/068108
§ 371 (c)(1),
(2), (4) Date: May 4, 2012

(87) PCT Pub. No.: WO2011/055621
PCT Pub. Date: Dec. 5, 2011

(65) Prior Publication Data
US 2012/0217901 A1     Aug. 30, 2012

(30) Foreign Application Priority Data

Nov. 5, 2009   (JP) ................................. 2009-253689

(51) Int. Cl.
*H05B 33/06* (2006.01)
(52) U.S. Cl.
USPC ......................................................... 315/312
(58) Field of Classification Search
None
See application file for complete search history.

(56) References Cited

U.S. PATENT DOCUMENTS

| | | | | |
|---|---|---|---|---|
| 7,088,417 B2 * | 8/2006 | Kamijima et al. | ............ | 349/152 |
| 2004/0189915 A1 * | 9/2004 | Taguchi et al. | ............... | 349/139 |
| 2006/0261734 A1 | 11/2006 | Lee | | |
| 2007/0036955 A1 * | 2/2007 | Hiruma et al. | ................ | 428/209 |
| 2008/0284963 A1 | 11/2008 | Kamiya et al. | | |
| 2008/0316414 A1 * | 12/2008 | Nakagawa et al. | ........... | 349/149 |
| 2012/0206067 A1 * | 8/2012 | Yamanaka | .................... | 315/312 |

FOREIGN PATENT DOCUMENTS

| | | |
|---|---|---|
| JP | 8-315981 | 11/1996 |
| JP | 2004-246330 | 9/2004 |
| JP | 2007-072033 | 3/2007 |

* cited by examiner

*Primary Examiner* — Jany Richardson
(74) *Attorney, Agent, or Firm* — McDermott Will & Emery LLP

(57) ABSTRACT

Provided is an organic EL panel which is passively driven and is capable of preventing variations in wiring resistance of electrode wirings without restricting the degree of freedom for wiring design and improving evenness in brightness of an organic EL element. The organic EL panel is formed of a light-emitting display unit (2) having a plurality of first electrode lines (2*a*) formed on a support substrate (1), an organic light-emitting layer (2*d*) formed on the first electrode lines (2*a*), and a plurality of second electrode lines (2*e*) formed so as to intersect the first electrode lines (2*a*). The organic EL panel has a plurality of electrode wirings (4) which is formed by being routed on the support substrate (1) so as to be connected with the second electrode lines (2*e*) or the first electrode lines (2*a*), and the electrode wirings (4) each have parts (4*a*, 4*c*) each of which is formed of one wiring and/or apart (4*b*) in which a plurality of wirings are connected in parallel with each other. The numbers of wirings provided in parallel are set to be different in an area where the wirings are formed in the same direction so that the difference in the wiring resistance between the electrode wirings becomes 5Ω or less.

2 Claims, 3 Drawing Sheets

X−X

ORGANIC EL PANEL

RELATED APPLICATIONS

This application is the U.S. National Phase under 35 U.S.C. §371 of International Application No. PCT/JP2010/068108, filed on Oct. 15, 2010, which in turn claims the benefit of Japanese Application No. 2009-253689, filed on Nov. 5, 2009, the disclosures of which Applications are incorporated by reference herein.

TECHNICAL FIELD

The invention relates to an organic EL panel which is formed of a light-emitting display having plural first electrode lines formed on a support substrate, an organic light-emitting layer formed on the first electrode lines, and plural second electrode lines formed so as to intersect with the first electrode lines.

BACKGROUND ART

As the conventional organic EL panels, there has been known a type of having a light-emitting display which has organic EL elements formed on a transparent support substrate as light-emitting pixels in a matrix shape, the organic EL elements being formed, for example, by interposing an organic layer at least having an organic light-emitting layer between anodes (first electrodes) formed of ITO (Indium Tin Oxide) and the like and cathodes (second electrodes) formed of aluminum (Al) and the like (for example, refer to Patent Document 1). The organic EL element injects a hole from the anode and injects an electron from the cathode; and the hole and the electron are re-coupled in the organic light-emitting layer, hence to emit a light. The organic EL element has what is called a diode characteristic that a current hardly flows from the cathode to the anode.

The above mentioned organic EL panel is a passive-matrix organic EL panel which controls the light emission of the organic EL elements through passive driving (driving in the order of lines), for example, with the anodes as data lines and the cathodes as common lines.

RELATED DOCUMENTS

Patent Documents

Patent Document 1: JP-A-8-315981
Patent Document 2: JP-A-2004-246330
Patent Document 3: JP-A-2007-72033

DISCLOSURE OF THE INVENTION

Problems To Be Solved By the Invention

In the passive-matrix organic EL panel, it is preferable that variation in wiring resistance is small between electrode wirings which apply drive currents to the both electrodes. When the variation in the wiring resistance between the electrode wirings is large, a difference occurs in voltages to be applied on the respective organic EL elements, which causes unevenness in brightness. The wiring distance gets longer according as the electrode wiring is drawn on the outer side of the support substrate, and therefore, a difference in the wiring resistance between the above electrode wiring and the electrode wiring placed inside becomes large. Accordingly, there have been known such conventional methods that the widths of the wirings are gradually widened to reduce the wiring resistances, thereby making the wiring resistances even, as disclosed in Patent Document 2 and that the wiring placed inside is provided with a redundant wiring length in a free space in order to make the wiring resistances equal, as disclosed in Patent Document 3.

In the method of simply widening the widths of the wirings as disclosed in Patent Document 2, however, when a position where the wiring width is large overlaps with a bonding position of a sealing material for sealing the light-emitting display, an ultraviolet ray may be prevented from irradiating an ultraviolet hardening bonding agent at a time of bonding the sealing material there with the bonding agent and the degree of freedom for wiring design gets restrictive disadvantageously in the case where this is prevented from happening. Further, the method disclosed in Patent Document 3 has the same problem of restricting the degree of freedom for wiring design because it needs a space for extending the wiring length as for the wiring placed inside.

Taking the above problems into consideration, the invention aims to provide a passive-matrix organic EL panel capable of preventing variation in wiring resistance between electrode wirings without restricting the degree of freedom for wiring design and capable of improving unevenness in brightness of an organic EL element.

Means For Solving the Problems

In order to solve the above problem, the invention provides an organic EL panel formed of a light-emitting display having plural first electrode lines formed on a support substrate, an organic light-emitting layer formed on the first electrode lines, and plural second electrode lines formed so as to intersect with the first electrode lines, in which plural electrode wirings are drawn and formed on the support substrate so as to connect with the respective second electrode lines or the respective first electrode lines, each of the electrode wirings has a portion including one wiring and/or a portion including plural wirings connected in parallel, and the number of the wirings provided in parallel is set various in an area where the wirings are formed in the same direction so that each difference in wiring resistance may be 5Ω or less.

The electrode wirings are various in the number of the wirings provided in parallel depending on an area.

According to the invention, the electrode wirings are formed in the structure having one wiring, in the structure in combination of the portion including one wiring and the portion including the plural wirings connected in parallel, or in the structure having the portion including the plural wirings connected in parallel; depending on the wiring length, the number of the wirings provided in parallel is set various in the area where the wirings are formed in the same direction, hence to make the difference in the wiring resistance 5Ω or less by adjusting an actual wiring width; and even when the wiring length of the electrode wiring is various, the variation in the wiring resistance between the electrode wirings can be restrained and unevenness of brightness in the organic EL elements can be improved. Even when the number of the wirings provided in parallel is increased, since interstices are formed between the respective wirings, an ultraviolet ray is not prevented from irradiating a bonding agent. Further, since it does not extend an extra wiring length, a space for extending the wiring length is not necessary.

Since the electrode wirings are formed in the structure where the number of the wirings is various depending on an area, it is possible to minutely adjust the wiring resistance of each of the electrode wirings and preferable to restrain the variations in the wiring resistance between the electrode wirings.

Advantage of the Invention

According to the invention, it is possible to restrain a variation in wiring resistance between electrode wirings without restricting the degree of freedom for wiring design and improve unevenness in brightness of an organic EL element.

MODE FOR CARRYING OUT THE INVENTION

Figure 1:
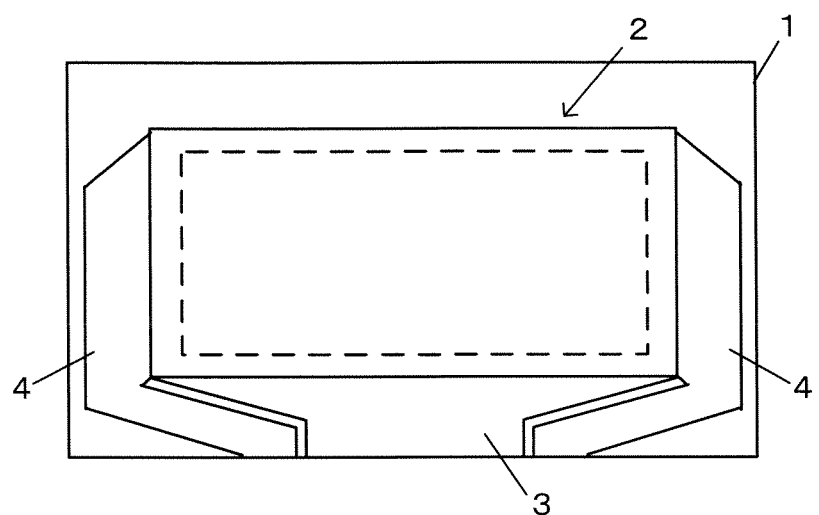
FIG. 1 is a view showing an organic EL panel that is an embodiment of the invention.

Hereinafter, an organic EL panel that is an embodiment of the invention will be described based on the attached drawings. FIG. 1 is a whole view of the organic EL panel and FIG. 2 is an enlarged view of an important portion of the organic EL panel.

A support substrate 1 is an electrically insulating substrate made of a rectangular transparent glass material. On the support substrate 1, a light-emitting display 2, an anode wiring 3 to be connected to an anode line of the light-emitting display 2 described later, a cathode wiring 4 to be connected to a cathode line of the light-emitting display 2 described later. On the support substrate 1, a sealing material for hermetically covering the light-emitting display 2 is provided; however, the sealing material is omitted in FIGS. 1 and 2.

Figure 2:
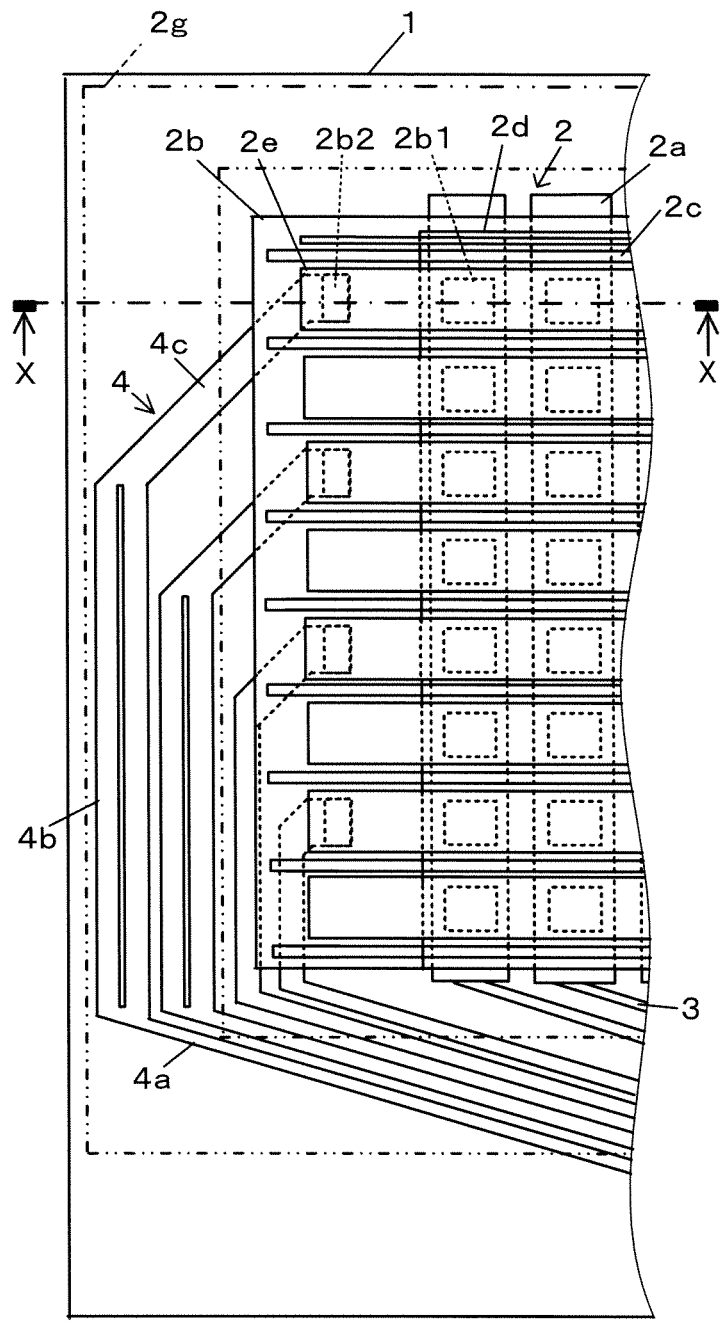
FIG. 2 is an enlarged view of an important portion of the organic EL panel.
Figure 3:
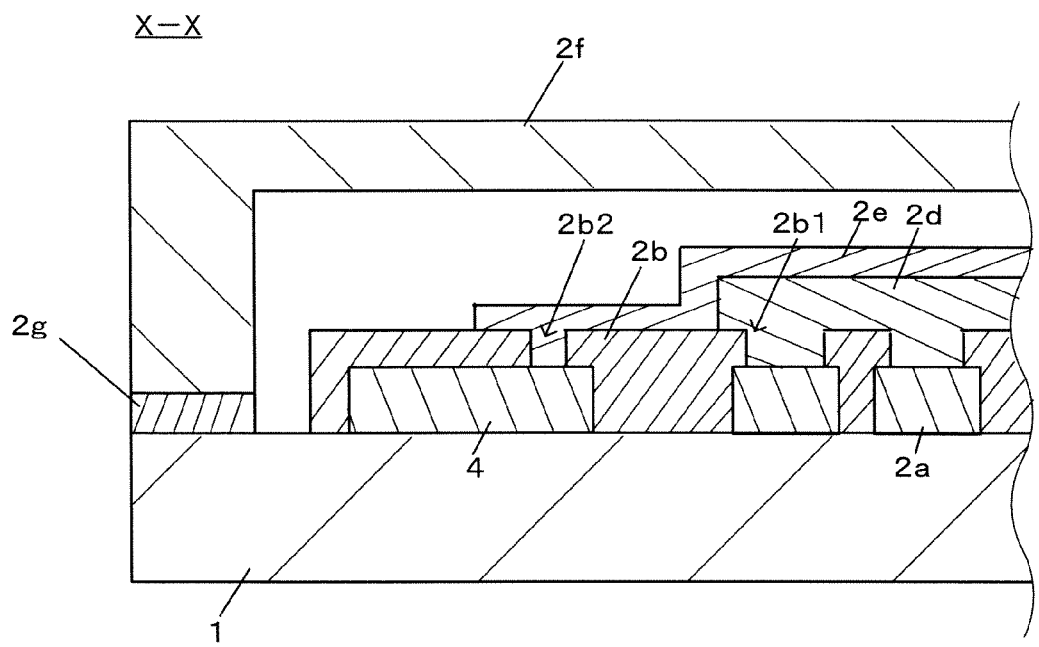
FIG. 3 is a cross-sectional view of an organic EL element showing the organic EL panel.

The light-emitting display 2 mainly includes plural anode lines (first electrode lines) 2a, an insulating layer 2b, a partition wall 2c, an organic layer 2d, and plural cathode lines (second electrode lines) 2e, as illustrated in FIGS. 2 and 3, and it is, what is called, a passive-matrix light-emitting display which includes plural light-emitting pixels (organic EL elements) formed by intersecting the respective anode lines 2a and the respective cathode lines 2e and interposing the organic layer 2d therebetween. Further, the light-emitting display 2 is hermetically covered by a sealing material 2f, as illustrated in FIG. 3.

The anode line 2a is formed of a transparent conductive material such as ITO. After the above conductive material is formed into a layer shape on the support substrate 1 through vapor deposition, sputtering, or the like, the plural anode lines 2a are formed in almost parallel according to photolithography and the like. The respective anode lines 2a are connected to the respective anode wirings 3, and electrically connected to a driver IC for supplying a drive current through the respective anode wirings 3.

The insulating film 2b is made of an electrically insulating polyimidic material, for example, and formed on the anode lines 2a so as to be placed between the anode lines 2a and the cathode lines 2e, hence to prevent short of the both electrode lines 2a and 2e. The insulating film 2b is provided with openings 2b1 which define and clearly outline the respective light-emitting pixels. Further, the insulating film 2b is extended between the cathode lines 2e and the cathode wirings 4 and provided with contact holes 2b2 which connect the cathode lines 2e and the cathode wirings 4.

The partition wall 2c is made of an electrically insulating phenoric material, for example, and formed on the insulating film 2b. The partition wall 2c is formed so that its cross section has an inverted taper shape with respect to the insulating film 2b, according to the photolithography and the like. The plural partition walls 2c are formed in a direction orthogonal to the anode lines 2a at regular intervals. The partition wall 2c is designed to decouple the organic layer 2d and the cathode lines 2e in a line shape when forming them through the vapor deposition, sputtering and the like from above.

The organic layer 2d is formed on the anode lines 2a and at least provided with an organic light-emitting layer. In this embodiment, the organic layer 2d is formed by sequentially stacking a hole injection layer, a hole transport layer, the organic light-emitting layer, and an electron transport layer through the vapor deposition, sputtering, and the like.

The plural cathode lines 2e are formed of a metal conductive material such as aluminum (Al) and, magnesium silver (Mg:Ag) having a higher conductivity than that of the anode lines 2a, through the sputtering, vapor deposition, or the like, in a way of intersecting with the respective anode lines 2a. The respective cathode lines 2e are connected to the respective cathode wirings 4 through the contact holes 2b2 provided on the insulating film 2b and electrically connected to the driver IC through these cathode wirings 4.

The sealing material 2f is a concave-shaped material formed of, for example, a glass material and provided on the support substrate 1 through an ultraviolet curing bonding agent 2g.

The anode wiring 3 is formed of a conductive material of, for example, ITO that is the same material as that of the anode lines 2a, chrome (Cr), aluminum (Al), or the like, or a stack of these conductive materials; the plural anode wirings 3 are drawn and formed on the support substrate 1 with one ends thereof connected to the respective anode lines 2a under the support substrate 1 and the other ends thereof aligned in rows on the lower side of the support substrate 1. The other ends of the respective anode wirings 3 are connected to the driver IC through a connection material, for example, FPC and the like.

The cathode wiring 4 is formed of a conductive material of, for example, ITO that is the same material as that of the anode lines 2a, chrome (Cr), aluminum (Al), or the like, or a stack of these conductive materials; the plural cathode wirings 4 are drawn and formed on the support substrate 1 with one ends thereof connected to the cathode lines 2e alternately on both sides of the support substrate 1 and the other ends thereof aligned in rows on the lower side of the support substrate 1. The other ends of the respective cathode wirings 4 are connected to the driver IC through the above connection material. Each of the cathode wirings 4 is formed so that at least its end portion that is a connecting position with the cathode line 2e is placed under the cathode line 2e through the insulating film. 2b in a way connectable to the cathode line 2e via the contact hole 2b2. As the cathode wiring 4 is drawn downwardly from the lateral side on the support substrate 1, a difference in the wiring length between the cathode wiring 4 drawn inside and the cathode wiring 4 drawn outside is larger than that in the anode wiring 3. In the embodiment, the cathode wiring 4 drawn inside is formed in one wiring and the cathode wiring 4 drawn outside is formed by a portion including one wiring (hereinafter, refer to as single wiring units 4a and 4c) and a portion including two wirings connected in parallel (hereinafter, a parallel wiring unit 4b), as illustrated in FIG. 2, so that a difference in wiring resistance between the cathode wirings 4 may be 5Ω or less. Although it is the most preferable that the wiring resistances of the respective cathode wirings 4 are identical, unevenness in brightness of the organic EL elements can be fully restrained as far as a difference in the wiring resistance between the maximum and the minimum is 5Ω or less. In the embodiment, the cathode wirings 4 have some areas; in an area where the biggest difference occurs in the wiring length between the outside cathode wiring 4 and the inside cathode wiring 4 and the wiring is drawn along the lateral side of the support substrate 1, the outside cathode wiring 4 is provided with the parallel wiring unit 4b, hence to actually widen the wiring width and to reduce the wiring resistance. Though the parallel wiring unit 4b is overlapped with an attached portion of the ultraviolet curing bonding agent 2g, interstices are provided between the respective wirings in the parallel wiring unit 4b, so that an ultraviolet ray can irradiate the ultraviolet curing bonding agent 2g through these interstices even in the structure actually having a large wiring width, hence to restrain the variation in the wiring resistance between the cathode wirings 4 without restricting the degree of freedom for the wiring design. In the outside cathode wiring 4, the number of the wirings provided in parallel is different in every area of one cathode wiring 4 between the single wiring units 4a and 4c and the parallel wiring unit 4b. Therefore, the wiring resistances of the respective cathode wirings 4 can be adjusted more minutely, which is suitable for restraining the variation in the wiring resistance between the cathode wirings 4. The number of the wirings in the parallel wiring unit 4b may be three or more. Further, the number of the wirings provided in parallel may be constant in one of the cathode wirings 4. Alternatively, a combination of the single wiring units 4a and 4c and the parallel wiring unit 4b may be various in the respective cathode wirings 4.

The organic EL panel is formed by the above mentioned units.

The organic EL panel is designed to set the number of the wirings provided in parallel to be different in an area where the wirings are formed in the same direction, depending on each wiring length, so that the difference in the wiring resistance between the respective cathode wirings 4 having various wiring lengths may be 5Ω or less, thereby making it possible to adjust the actual wiring width, restrain variation in the wiring resistance between the respective cathode wirings 4, and improve unevenness of brightness in the organic EL elements. Further, even when the number of the wirings provided in parallel is increased, since interstices are formed between the respective wirings, an ultraviolet ray is not prevented from irradiating the ultraviolet curing bonding agent 2g. Further, since it does not extend the extra wiring length, a space for extending the wiring length is not necessary. Therefore, the invention does not restrict the degree of freedom for the wiring design of the cathode wiring 4.

Although the invention is adopted to the cathode wiring 4, of the electrode wirings connected to the both electrode lines 2a and 2e of the light-emitting display in the embodiment, the invention may be adopted to the anode wiring 3 in another design of wiring drawing and the number of the wirings provided in parallel may be various in an area where the anode wirings 3 are formed in the same direction.

Although the embodiment is the organic EL panel in which the driver IC is provided separately from the FPC, the circuit substrate, and the like, the invention maybe similarly adopted to what is called a COG typed organic EL panel in which the driver IC is directly provided on the support substrate 1.

Industrial Applicability

The invention is suitable for a passive-matrix organic EL panel.

DESCRIPTION OF REFERENCE NUMERALS AND SIGNS 1 support substrate
2 light-emitting display
2a anode line (first electrode line)
2b insulating film
2c partition wall
2d organic layer
2e cathode line (second electrode line)
2f sealing material
2g bonding agent
3 anode wiring
4 cathode wiring
4a, 4c single wiring unit
4b parallel wiring unit

The invention claimed is:

1. An organic EL panel comprising:
a light-emitting display including a plurality of first electrode lines formed on a support substrate, an organic light-emitting layer formed on the first electrode lines, and
a plurality of second electrode lines formed so as to intersect with the first electrode lines, wherein
a plurality of electrode wirings are drawn and formed on the support substrate so as to connect with the respective second electrode lines or the respective first electrode lines, and
each of the electrode wirings has a portion including one wiring and/or a portion including a plurality of wirings connected in parallel, and the number of the wirings provided in parallel is set various in an area where the wirings are formed in the same direction so that each difference in wiring resistance becomes 5Ω or less.

2. The organic EL panel according to claim 1, wherein the electrode wirings are various in the number of the wirings provided in parallel depending on an area.

* * * * *